(12) United States Patent
Li et al.

(10) Patent No.: US 9,673,047 B2
(45) Date of Patent: Jun. 6, 2017

(54) SOLID PHASE EPITAXY OF 3C—SIC ON SI(001)

(71) Applicants: Connie H. Li, Alexandria, VA (US); Glenn G. Jernigan, Waldorf, MD (US); Berend T. Jonker, Waldorf, MD (US); Ramasis Goswami, Alexandria, VA (US); Carl S. Hellberg, Bethesda, MD (US)

(72) Inventors: Connie H. Li, Alexandria, VA (US); Glenn G. Jernigan, Waldorf, MD (US); Berend T. Jonker, Waldorf, MD (US); Ramasis Goswami, Alexandria, VA (US); Carl S. Hellberg, Bethesda, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/872,308

(22) Filed: Oct. 1, 2015

(65) Prior Publication Data

US 2016/0118465 A1 Apr. 28, 2016

Related U.S. Application Data

(60) Provisional application No. 62/067,021, filed on Oct. 22, 2014.

(51) Int. Cl.
*H01L 29/161* (2006.01)
*H01L 21/02* (2006.01)
*H01L 29/04* (2006.01)

(52) U.S. Cl.
CPC .. *H01L 21/02587* (2013.01); *H01L 21/02381* (2013.01); *H01L 21/02433* (2013.01); *H01L 21/02447* (2013.01); *H01L 21/02513* (2013.01); *H01L 21/02529* (2013.01); *H01L 21/02612* (2013.01); *H01L 21/02527* (2013.01);
(Continued)

(58) Field of Classification Search
CPC ......... H01L 21/02444; H01L 21/02433; H01L 21/02447; H01L 29/161; H01L 29/165; H01L 29/1608; H01L 29/66053; H01L 29/6606; H01L 29/66068
See application file for complete search history.

(56) References Cited

U.S. PATENT DOCUMENTS 6,214,107 B1 * 4/2001 Kitabatake .............. C30B 33/00
117/95

OTHER PUBLICATIONS

Kukushkin, S. A., and A. V. Osipov. "New method for growing silicon carbide on silicon by solid-phase epitaxy: Model and experiment." Physics of the Solid State 50.7 (2008): 1238-1245.
(Continued)

*Primary Examiner* — Matthew Landau
*Assistant Examiner* — Scott Stowe
(74) *Attorney, Agent, or Firm* — US Naval Research Laboratory; Stephen T. Hunnius

(57) ABSTRACT

A method of making a SiC buffer layer on a Si substrate comprising depositing an amorphous carbon layer on a Si(001) substrate, controlling the thickness of the amorphous carbon layer by controlling the time of the step of depositing the amorphous carbon layer, and forming a deposited film. A 3C—SiC buffer layer on Si(001) comprising a porous buffer layer of 3C—SiC on a Si substrate wherein the porous buffer layer is produced through a solid state reaction.

6 Claims, 5 Drawing Sheets

(52) U.S. Cl.
 CPC .. *H01L 21/02631* (2013.01); *H01L 21/02658* (2013.01); *H01L 29/045* (2013.01)

(56) References Cited

OTHER PUBLICATIONS

Goswami, R., et al. "Solid phase epitaxial growth of 3C—SiC thin film on Si and annihilation of nanopores." Acta Materialia 65 (2014): 418-424.
Sorokin, L. M., et al. "Electron-microscopic investigation of a SiC/Si (111) structure obtained by solid phase epitaxy." Technical Physics Letters 34.11 (2008): 992-994.

\* cited by examiner

SOLID PHASE EPITAXY OF 3C—SIC ON SI(001)

This application claims priority to and the benefits of U.S. Patent Application No. 62/067,021 filed on Oct. 22, 2014, the entirety of which is herein incorporated by reference.

BACKGROUND

Silicon carbide (SiC) possesses unique electronic and physical properties such as wide band gap, high breakdown field, high thermal conductivity, and low thermal expansion coefficient. These unique electronic and physical properties make it the material of choice for power electronics that withstand higher breakdown voltage and operate at higher temperatures, far exceeding the performance of their Si counterparts.

SiC exists in a variety of polymorphic crystalline structures called polytypes, e.g., 3C—SiC, 6H—SiC, 4H—SiC, etc., where "C" indicates cubic phases, and "H" hexagonal. The different polytypes can be described by the different ordering, or stacking sequence, of the Si—C bilayers along the c-axis, and can have a wide range of different electronic and physical properties. Out of the more than 200 polytypes, the 3C (cubic zinc blende), 4H and 6H hexagonal structures have the lowest formation energies.

The 3C—SiC is the only cubic phase, and is advantageous for metal-oxide-semiconductor (MOS) device architecture due to its higher channel mobility because near interface traps are not active in the $SiO_2$/3C—SiC system. In addition, its cubic structure in principle enables it to be realized as a thin film on Si(001) and thereby readily integrated with current Si MOS technology, a key criterion for future technological application. Conversely, the hexagonal structure of the 4H and 6H phases are incompatible with growth on Si(001). Integration as a thin film on Si also has significant economic implications, because SiC bulk crystals are very costly to produce, and at present only the 4H— and 6H—SiC bulk wafers are available commercially—no bulk 3C—SiC single crystal substrate wafers are available, and thus it must be grown on a different substrate.

Therefore there has been significant interest to produce low-cost, large area 3C—SiC films on a low cost substrate which serves as a surrogate substrate for subsequent epitaxial growth of 3C—SiC single crystal thin film device heterostructures.

In recent years, considerable efforts have been spent on the growth of SiC on Si substrates, typically by molecular beam epitaxy (MBE) and chemical vapor deposition (CVD) techniques. However, due to the large lattice mismatch (20%), the resulting SiC films are not of high enough quality required for high-power electronic devices. The use of a buffer layer has been shown to seed the growth of higher quality SiC films. Previous buffer layers have been created through the chemical reaction of the Si substrate and carbon-containing gases such as $C_2H_4$ and CO at elevated temperatures.

When the buffer is porous, as is in the case of CO due to the formation of volatile Si—O species, the significant relaxation of the elastic stresses between the SiC film and Si substrate leads to films with far less defects.

However, this process with CO gas has only been done during high pressure CVD.

Here, an alternate method of producing a porous SiC buffer layer on a Si substrate is demonstrated, through solid state reaction with a pre-deposited amorphous C film at about 950° C. in ultrahigh vacuum (UHV).

This new method has several advantages over current processes. First, the resulting 3C—SiC buffer layer is much thinner (1-2 nm), with a thickness directly controlled by the thickness of the C film. Second, it works at a much lower temperature (about 950° C.) than those with gaseous species (1100-1400° C.), reducing the thermal budget and the excess energy available for formation of undesirable defects. Third, it is compatible with both CVD and MBE, the two major techniques used to grow device quality 3C—SiC heterostructures.

SUMMARY OF THE INVENTION

This invention demonstrates a new route for the synthesis of a 3C—SiC buffer layer on Si(001) for the purpose of seeding subsequent epitaxial growth of 3C—SiC on Si(001) for the integration of 3C—SiC with Si electronic technology. The synthesis occurs by depositing and annealing an amorphous carbon film on Si(001), resulting in solid state epitaxy of a few nanometer thick crystalline 3C—SiC layer on Si(001).

DETAILED DESCRIPTION

This invention demonstrates a new route for the synthesis of a 3C—SiC buffer layer on Si(001) for the purpose of seeding subsequent epitaxial growth of 3C—SiC on Si(001) for the integration of 3C—SiC with Si electronic technology. The synthesis occurs by depositing and annealing an amorphous carbon film on Si(001), resulting in solid state epitaxy of a few nanometer thick crystalline 3C—SiC layer on Si(001).

This is a method of producing a porous SiC buffer layer on a Si substrate.

This method concerns a solid state reaction with a pre-deposited amorphous C film at about 950° C. in ultrahigh vacuum (UHV).

Example 1

The amorphous carbon layer is deposited on a hydrogen passivated Si(001) substrate by magnetron sputtering of a C target at room temperature at a rate of 0.8 nm/min. The layer thickness can be precisely controlled by deposition time.

Example 2

The sputtering conditions were 15 sccm Ar flow, 3 mT total pressure, and 100 W DC plasma power.

Figure 1:
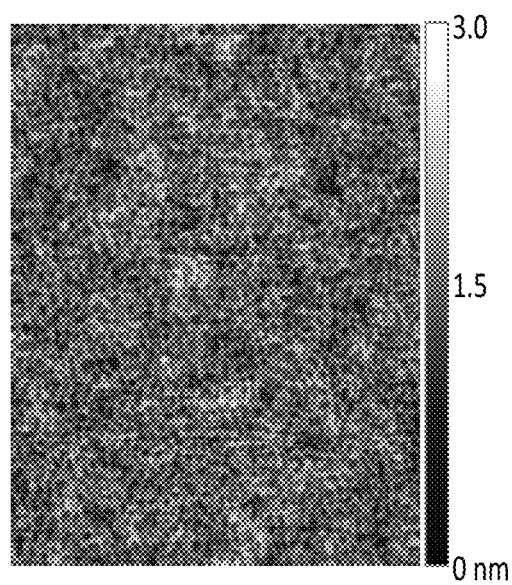
FIG. 1 illustrates an atomic force microscopy (AFM) image of as-deposited amorphous C film on Si(001), showing a root-mean-square (RMS) roughness of 0.3 nm.

The deposited film exhibits a smooth surface morphology with a root-mean-square (RMS) roughness of 0.3 nm as determined by atomic force microscopy, as illustrated in FIG. 1.

Example 3

The samples were then mounted on a Ta holder and transferred into an ultrahigh vacuum (UHV) system with a high-temperature heating stage. To form the SiC layer, samples were annealed at temperatures up to 950° C. for 30 minutes, with a ramp rate of ~1° C./sec and pressure below $2 \times 10^{-9}$ Torr. The temperature was monitored by a thermocouple embedded in the heating stage.

Figure 2:
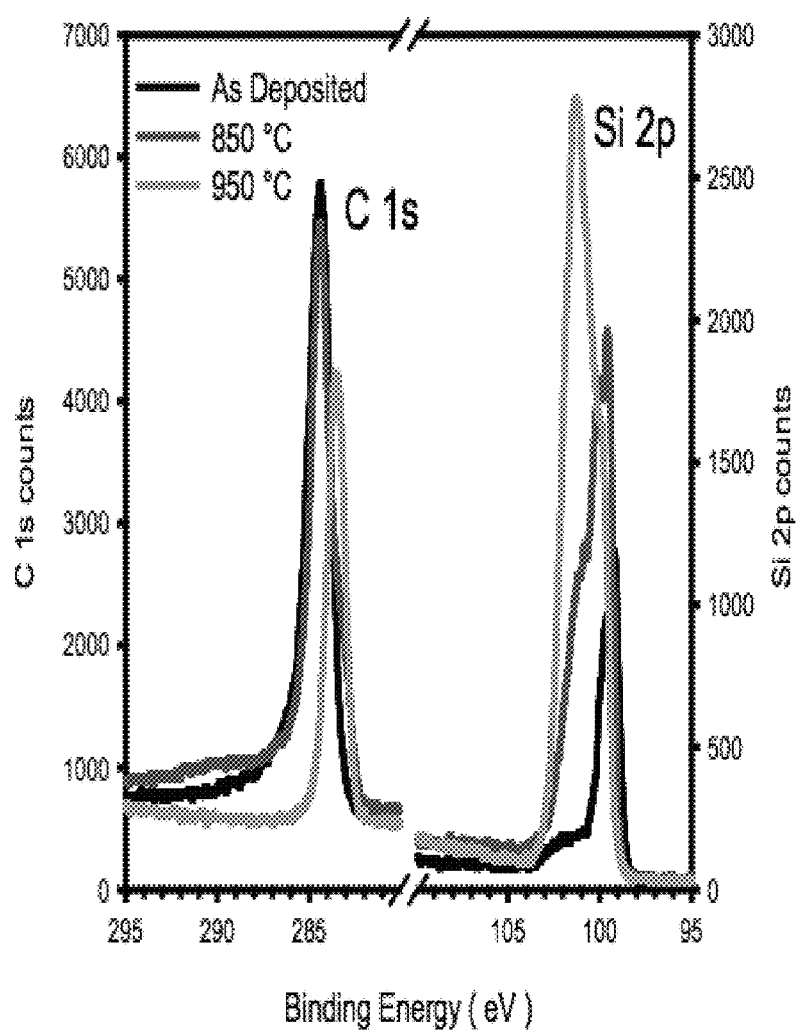
FIG. 2 illustrates an X-ray photoelectron spectroscopy (XPS) spectra for the C 1s and Si 2p signals for the 2 nm amorphous C film as-deposited, after annealing at 850° C. and 950° C. in ultrahigh vacuum (UHV) for 30 minutes.

The formation of SiC is monitored by in situ x-ray photoelectron spectroscopy (XPS). Shown in FIG. 2 are XPS spectra for the C 1s and Si 2p signals for the as-deposited amorphous carbon film, and upon annealing at 850 and 950° C. The as-deposited C film exhibits a single carbon peak at 284 eV and doublet Si 2p peak at 99.5 eV with a broad hump at ~102 eV. The feature at ~102 eV is indicative of the formation of suboxides, which typically forms during or after the carbon deposition. For annealing below 850° C., no changes in the C 1s or Si 2p peaks were observed, indicating no reactions between the C and Si substrate.

Upon annealing at 850° C., we observe the presence of a shoulder on the C 1s peak at ~282.5 eV and the onset of a peak at 101.5 eV in the Si 2p spectra. These emerging features with shifts in binding energy are consistent with the formation of Si—C bonds. The O 1s peak (not shown) is nearly absent indicating that the suboxide has either decomposed or desorbed at this temperature.

Upon annealing at 950° C., a single C peak is observed at 282.5 eV, indicating a complete conversion of C—C bonds to C—Si bonds. Similarly, the Si 2p peak is now composed of two peaks; a doublet at 99.5 eV characteristic of the substrate, and a peak at 101.5 eV indicative of the Si—C bond. These results indicate that initial SiC formation occurs at 850° C., and a complete SiC layer is formed at 950° C.

Figure 3:
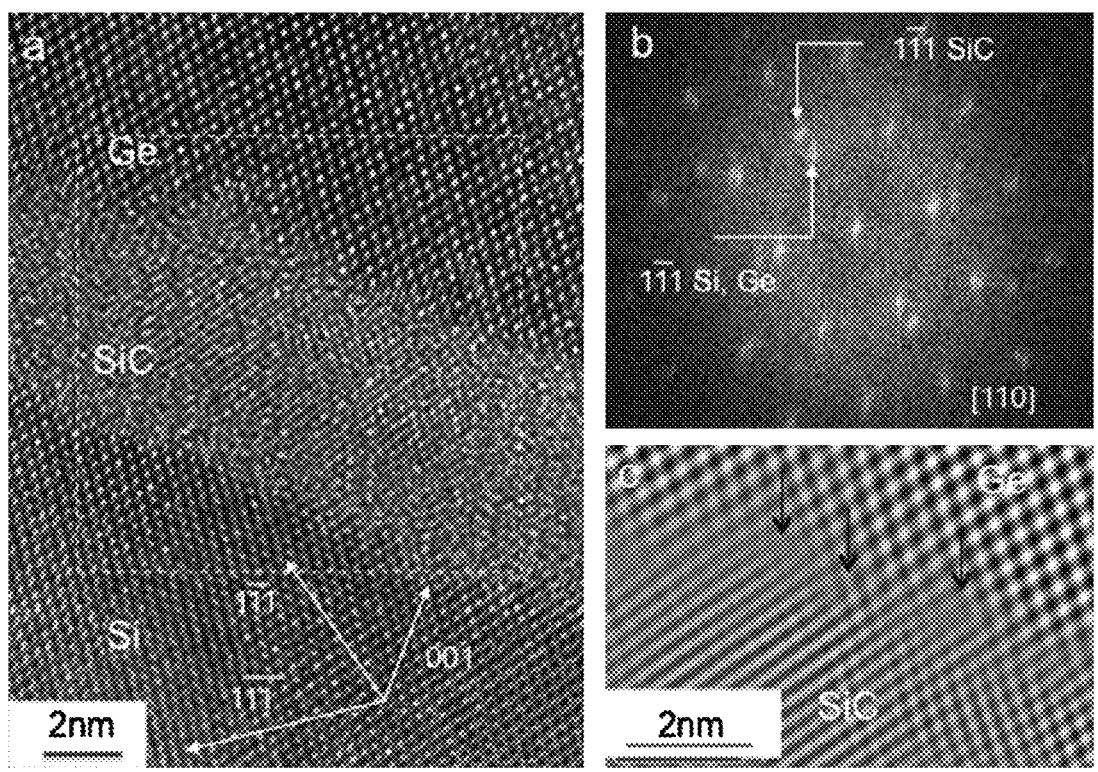
FIG. 3 illustrates a high-resolution transmission electron microscopy (HRTEM) image close to the [110] zone of Si of a 2 nm amorphous C thin film annealed at 950° C., showing the 3C—SiC on top of Si(001). The HRTEM image shows the cube-on-cube orientation of Ge/SiC/Si layers. The fast Fourier transform (FFT) pattern generated from the box area shows a d-spacing between {111} planes consistent with that of 3C—SiC including all three layers shows the orientation relation. An inverse fast Fourier transform image (IFFT) showing a set of misfit dislocations at the Ge/SiC interface.

FIG. 3 shows a high-resolution transmission electron microscopy (TEM) image of a sample annealed at 950° C. A ~5 nm thick SiC is seen on top of the Si(001) with a high density of fine faults along {111} planes. The fast Fourier transform (FFT) close to the [110] zone axis generated from the box area containing a portion of Si and SiC is shown as an inset. The d-spacing of {111} planes of SiC, calibrated with respect to Si(111), is ~2.51 Å, consistent with that of 3C—SiC. The angle between two sets of SiC {111} planes is ~70.5°, confirming that it is fcc type. It exhibits a cube-on-cube orientation relationship that can be written as $(1\text{-}11)_{Si}\|(1\text{-}11)_{SiC}$ and $[110]_{Si}\|[110]_{SiC}$. Note that the streaks seen along the [1-11] direction in the FFT pattern are due to the fine faults, which help relieves the strain due to the large lattice mismatch between SiC and Si.

Figures 4A, 4B:
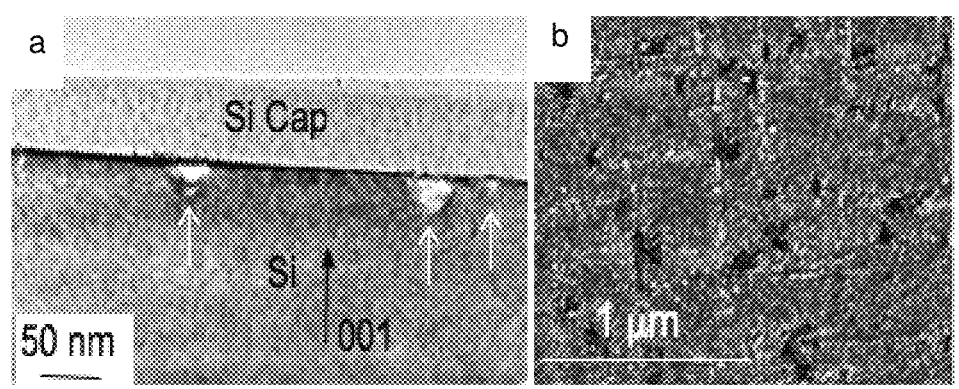
FIG. 4A illustrates a low-magnification multibeam image of Si, SiC and Si cap layers. The pores below the SiC epilayer in the Si substrate are indicated by white arrows.
FIG. 4B illustrates an AFM image of the SiC surface showing a high density of pores.

Pores tens of nanometers in diameter and ~20 nm deep are also observed below the SiC epilayer in the Si substrate for samples annealed at 950° C., as illustrated in FIG. 4A. AFM observations also show pits spaced hundreds of nanometers apart on the surface of the SiC, where areas between pores exhibit a smooth morphology, consistent with the crystallization of the SiC. These observations of the pores are similar to those due to reactions with CO gas, which has been shown to help relieve strain and improve epilayer quality, and are formed here as a result of the outward diffusion of Si atoms to react with the C that are on the surface to form SiC.

Figure 5:
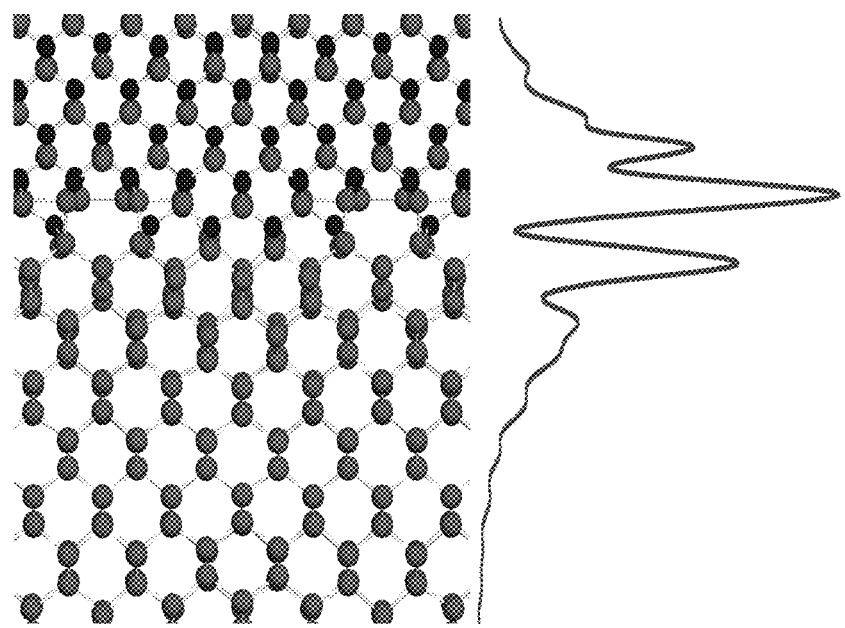
FIG. 5 illustrates a structure of the SiC/Si interface with C atoms and Si atoms. The large lattice mismatch results in dislocations at the interface that are spaced approximately every 4 Si lattice spacings and every 5 SiC lattice spacings. Planar averaged density of the acceptor band located 230 meV above the Si valence band. It is well localized at the interface.

The structure and electronic properties of the SiC/Si interface is calculated by density functional theory (DFT). Many interfaces were examined with varying stoichiometries. The interface with the lowest free energy is shown in FIG. 5, which contains less than a monolayer of C at the interface. The large lattice mismatch results in dislocations at the interface that are spaced approximately every 4 Si lattice spacings and every 5 SiC lattice spacings. The Si valence band is found to be at 1.27 eV above the SiC valence band. Thus the conduction bands are nearly identical across the interface. One mid-gap state, an acceptor band 230 meV above the Si valence band, appears and is well localized at the interface. The planar averaged charge density is also shown.

This all-solid thin film route offers a new approach for the solid phase epitaxy of a single crystalline 3C—SiC buffer layer to seed the growth of high quality 3C—SiC epilayer for the integration with Si MOS technology.

The use of a pre-deposited amorphous C layer as the carbon source in place of gaseous species such as CO offers significant advantages that the SiC buffer layer is single cubic phase, works at a much lower temperature (950° C.) than those with gaseous species (1100-1300° C.), is compatible with MBE and with CVD.

This new process also produces a porous SiC buffer layer which will relieve strain and improve crystallinity of the SiC epilayer. In addition, the SiC buffer layer can be much more precisely controlled down to the nanometer scale, by controlling the thickness of the amorphous carbon layer.

Many modifications and variations of the present invention are possible in light of the above teachings. It is therefore to be understood that the claimed invention may be practiced otherwise than as specifically described. Any reference to claim elements in the singular, e.g., using the articles "a," "an," "the," or "said" is not construed as limiting the element to the singular.

What we claim is:

1. A method of making a SiC buffer layer on a Si substrate, comprising:
  depositing an amorphous carbon layer on a Si(001) substrate;
  controlling the thickness of the amorphous carbon layer by controlling the time of the step of depositing the amorphous carbon layer;
  forming a deposited film;
  annealing the deposited film and the Si(001) substrate; and
  forming a SiC buffer layer on the Si(001) substrate;
  wherein the step of depositing the amorphous carbon layer on the Si(001) substrate is by magnetron sputtering of a C target at room temperature at a rate of 0.8 nm/min.

2. The method of making a SiC buffer layer on a Si substrate of claim 1 wherein the Si(001) substrate is hydrogen passivated by chemical etching using hydrofluoric acid (HF), prior to the step of depositing a carbon layer, and wherein the deposited film has a root-mean-square roughness of about 0.3 nm.

3. The method of making a SiC buffer layer on a Si substrate of claim 2 wherein the deposited amorphous carbon film on the Si(001) substrate is annealed and wherein the step of annealing is at a temperature of from about 850° C. to about 950° C. for about 30 minutes.

4. The method of making a SiC buffer layer on a Si substrate of claim 1 wherein the magnetron sputtering comprises 15 sccm Ar flow, 3 mT pressure, and 100 W DC plasma power.

5. The method of making a SiC buffer layer on a Si substrate of claim 1 wherein the step of annealing at a temperature of about 950° C. comprises a ramp rate of about 1° C./sec and pressure below $2 \times 10^{-9}$ Torr.

6. The method of making a SiC buffer layer on a Si substrate of claim 1 wherein the method is via a solid state reaction.

* * * * *